United States Patent
Wu et al.

(10) Patent No.: US 6,326,276 B1
(45) Date of Patent: Dec. 4, 2001

(54) METHOD FOR FORMING A CAPACITOR IN DRAM

(75) Inventors: King-Lung Wu, Chia-Li Chen; Chuan-Fu Wang, San-Chung, both of (TW)

(73) Assignee: United Microelectronics Corp. (TW)

(*) Notice: Subject to any disclaimer, the term of this patent is extended or adjusted under 35 U.S.C. 154(b) by 0 days.

(21) Appl. No.: 09/371,414

(22) Filed: Aug. 10, 1999

(51) Int. Cl.$^7$ .................................................. H01L 21/20

(52) U.S. Cl. ............................................................. 438/396

(58) Field of Search ....................... 438/396, 220

(56) References Cited

U.S. PATENT DOCUMENTS

| | | | |
|---|---|---|---|
| 5,668,039 | * | 9/1997 | Lin . |
| 5,811,332 | * | 9/1998 | Chao . |
| 6,093,601 | * | 7/2000 | Tsai et al. . |

* cited by examiner

Primary Examiner—George Fourson
Assistant Examiner—Michelle Estrada

(57) ABSTRACT

A method for forming a capacitor in DRAM is disclosed. The method includes: providing a conductor defined on a first dielectric layer; forming a second dielectric layer on the conductor; then forming a polysilicon layer on the second dielectric layer, the polysilicon layer serves as an etching mask; next, etching the second dielectric layer; removing said polysilicon layer; etching said conductor; and finally removing said second dielectric layer.

22 Claims, 3 Drawing Sheets

METHOD FOR FORMING A CAPACITOR IN DRAM

BACKGROUND OF THE INVENTION

1. Field of the Invention

The present invention relates to a semiconductor capacitor, and more particularly to a method for forming a cylindrical capacitor in a dynamic random access memory (DRAM) cell.

2. Description of the Prior Art

Demand for dynamic random access memories (DRAMs) has rapidly increased owing to widespread use of integrated circuits. An integral part of a DRAM is storage capacitors, one of which is associated with each bit of information that is to be stored and/or read. These capacitors have typical capacity values, which allow them to be formed in situ together with other components such diodes and transistors. In order to minimize the amount of real estate occupied by the capacitors it has become routine to depart from a simple flat plate geometry and to give them a three dimensional aspect such as a hollow cylinder.

Further, in order to adapt the trend of reducing dimensions of semiconductor devices, sub-micron technologies were widely spread today. In the fabrication of capacitors in a DRAM cell, conventional masks are commonly used for photolithography processes, for example, to define the pattern on photoresist. After exposure, the unnecessary portion of the photoresist is stripped away, the residual portion then serves an etching mask which facilitates the subsequent etch process for forming capacitors. But in the sub-micron process (especially in the process for 0.18 $\mu$m or less critical dimension), the conventional masks have very high prices leading to increasing the cost of fabrication for DRAM.

For the reason mentioned above, there is a need to develop a method that can reduce the number of masks used to fabricate DRAM. Moreover, the cost of fabrication will be reduced, too.

SUMMARY OF THE INVENTION

In accordance with the present invention, a method is provided for forming capacitors. It substantially reduces the number of mask and the cost of fabrication for DRAM. In one embodiment, It's illustrated to form a hollow cylindrical capacitor. Firstly, a solid cylindrical conductor on a first dielectric layer is provided, then a second dielectric layer is formed on the solid cylindrical conductor. Next, a polysilicon layer is formed on the second dielectric layer, wherein a portion of the second dielectric layer is exposed. The etch process is used to etch the second dielectric layer till top surface of the solid cylindrical conductor is exposed; after removing the polysilicon layer, the solid cylindrical conductor is etched. After removing the second dielectric layer, the hollow cylindrical capacitor is achieved.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
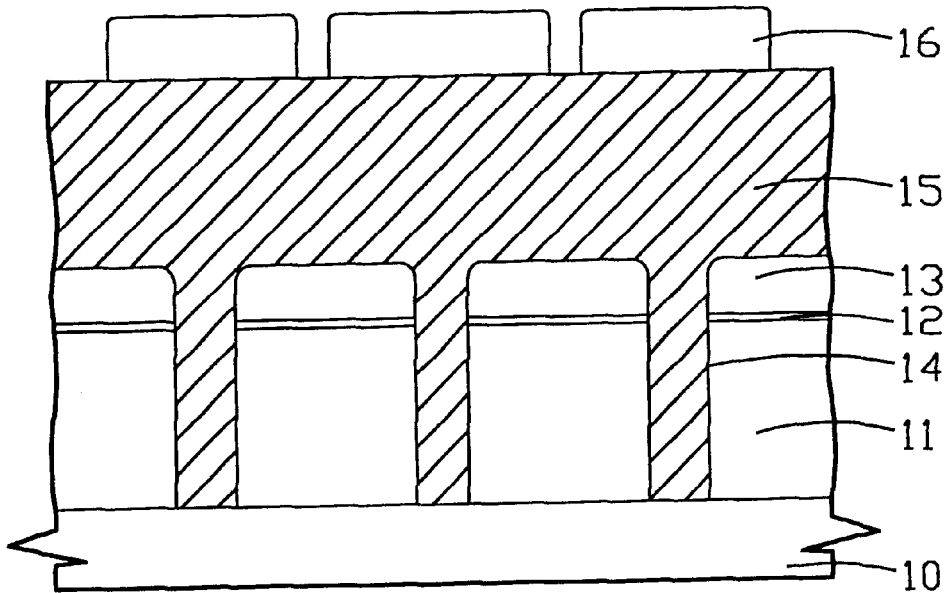
FIG. 1–FIG. 6 show the flow cross-section views concerned with fabricating hollow cylindrical capacitors by the present invention.

In one embodiment of the present invention, firstly, solid cylindrical conductors are formed by the conventional processes described below. Referring to FIG. 1, a dielectric layer 11, such as oxide, is deposited over a substrate 10. It's used to insulate the capacitors from the underlying devices. After a nitride layer 12 is deposited on the oxide layer 11, a thin oxide layer 13 is then deposited on the nitride 12 layer. Next, the photolithography and anisotroic etch processes are used to complete node contacts 14.

Figure 2:
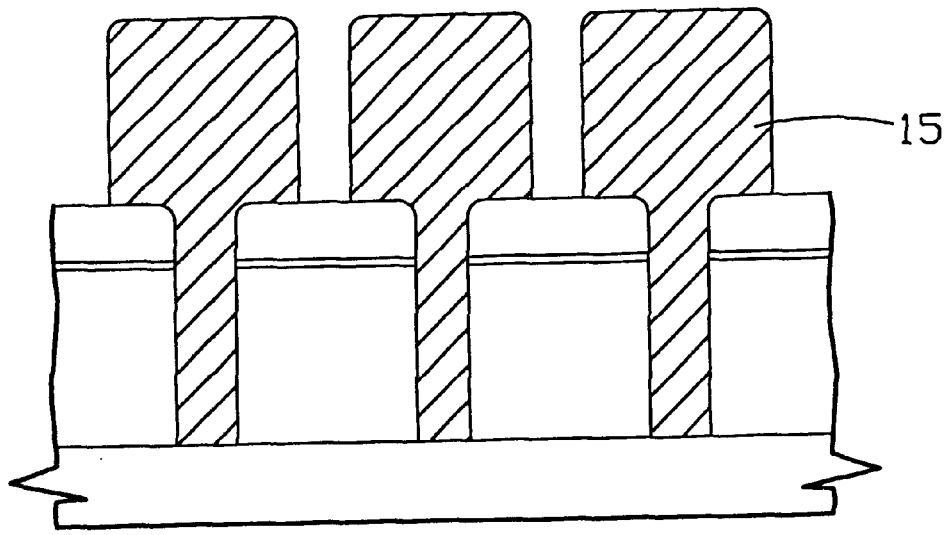

A polysilicon layer 15 or other conductor is formed on the thin oxide layer 13 and fills the node contacts 14. Subsequently, a patterned photoresist 16 is formed on the polysilicon layer 15. The following steps are etching the polysilicon layer 15 by anisotropic etch process and stripping the phoresist 16, then the solid cylindrical conductors as shown in FIG. 2 are achieved. Therein, the residual polysilicon layer 15 has solid cylindrical aspects. Each of the cylinders is about 0.9 $\mu$m high, and about 0.8 $\mu$m in diameter. Distance between two cylinders is about 0.15 $\mu$m.

Figure 3:
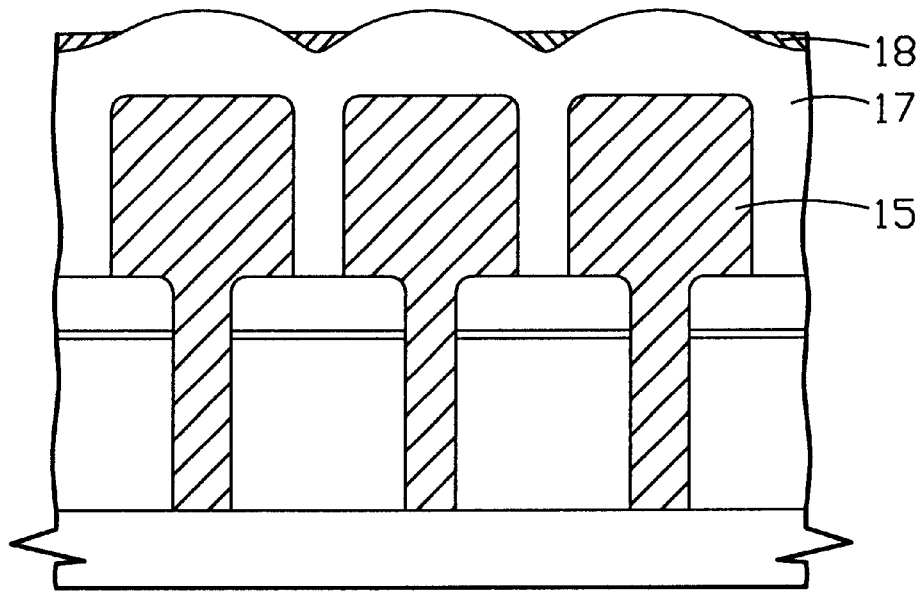

Referring to FIG. 3, a dielectric layer 17, such as oxide here, is deposited on the polysilicon layer 15. Therein, the oxide 17 has a wave-like top. The convex part of the top is located over the solid cylinders of the polysilicon layer 15; the concave part is located over the region between two solid cylinders. In the next step, a polysilicon 18 is deposited on the oxide 17 and then etched back. The etch back process makes the convex part of the oxide 17 exposed.

Figure 4:
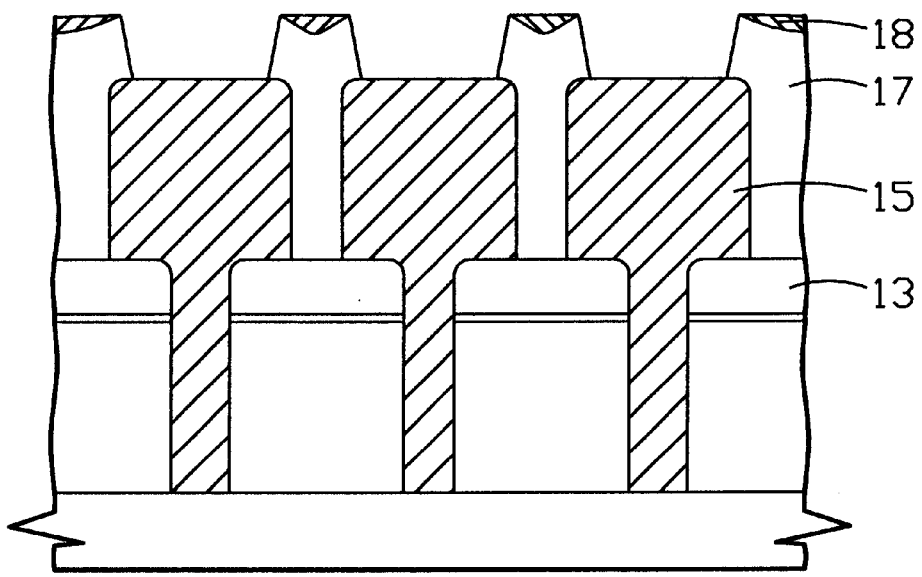

Referring to FIG. 4, anisotropic etch process is used to etch the oxide 17 till the top surface of the polysilicon layer 15 is exposed. In the process, the polysilicon 18 serves as an etching mask used to protect the underlying portion of the oxide 17 from this etch.

Figure 5:
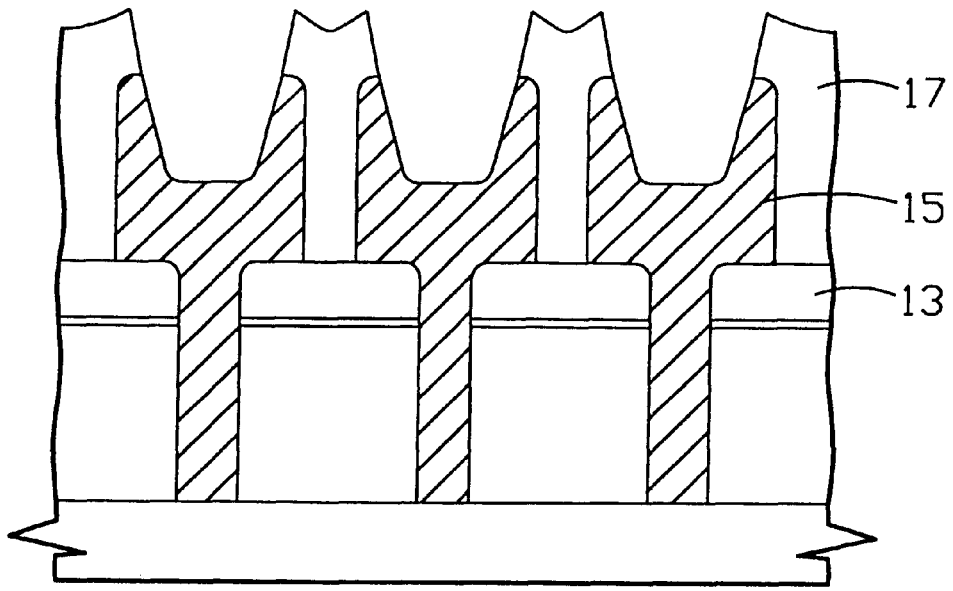

Both the polysilicon layer 15 and the polysilicon 18 are etched by anisotropic etch. The etch process is stopped when the polysilicon 18 is all removed. On the other hand, the solid cylinders of the polysilicon layer 15 are resulted in hollow cylindrical aspects after etched. Then the structure as shown in FIG. 5 is completed.

Figure 6:
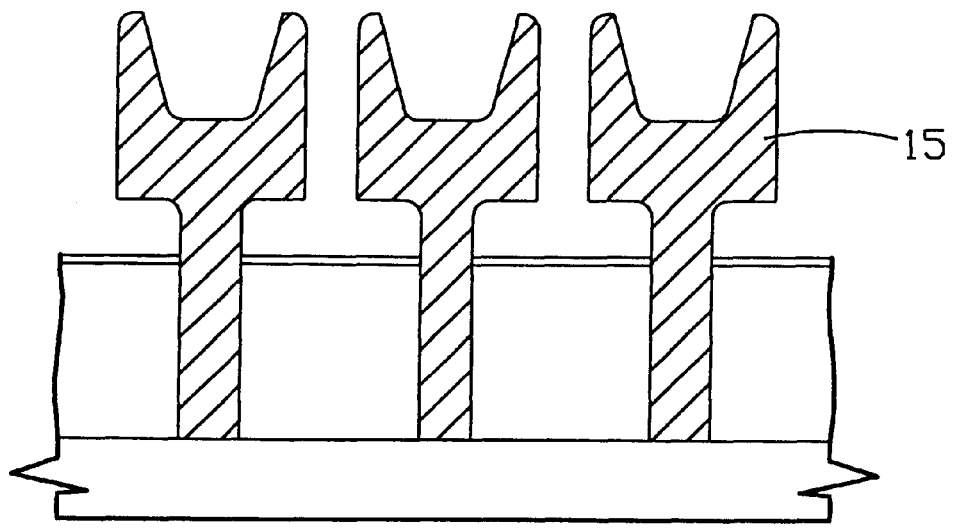

Further, etch process is used to remove the oxide 17 and the thin oxide layer 13, then the hollow cylindrical capacitors 15 as shown in FIG. 6 are completed. Its inner diameter is about 0.5 $\mu$m.

In the present invention, the etching mask employs polysilicon instead of conventional mask which has a high price, so that the cost of fabrication for DRAM is reduced.

Although specific embodiments have been illustrated and described, it will be obvious to those skilled in the art that various modifications may be made without departing from what is intended to be limited solely by the appended claims.

What is claimed is:

1. A method for forming a capacitor in dynamic random access memory, the method comprising:

providing a conductor defined on a first dielectric layer;

forming a second dielectric layer, wherein the surface of said second dielectric layers has a concave and a convex portion on said conductor;

forming a polysilicon layer on said second dielectric layer, said polysilicon layer serves as an etching mask;

etching said second dielectric layer by using said etching mask;

removing said polysilicon layer;

etching said conductor; and removing said second dielectric layer.

2. The method according to claim 1, wherein said conductor comprises polysilicon.

3. The method according to claim 1, wherein said conductor includes a solid cylindrical conductor.

4. The method according to claim 1, wherein said first dielectric layer comprises oxide.

5. The method according to claim 1, wherein said first dielectric layer comprises nitride.

6. The method according to claim 1, wherein said second dielectric layer comprises oxide.

7. The method according to claim 3, wherein said solid cylindrical conductor is located under said convex part of said second dielectric layer.

8. The method according to claim 1, wherein said polysilicon is formed by deposition process.

9. The method according to claim 1, wherein said etching mask is patterned.

10. A method for forming a hollow cylindrical capacitor, the method comprising:

provi ding a solid cylindrical conductor on a first dielectric layer;

forming a second dielectric layer on said solid cylindrical conductor;

forming a polysilicon layer on said second dielectric layer, wherein a portion of said second dielectric layer is exposed;

etching said second dielectric layer until the top surface of said solid cylindrical conductor is exposed;

removing said polysilicon layer;

etching said solid cylindrical conductor; and removing said second dielectric layer.

11. The method according to claim 10, wherein said solid cylindrical conductor comprises polysilicon.

12. The method according to claim 10, wherein said first dielectric layer comprises oxide.

13. The method according to claim 10, wherein said first dielectric layer comprises nitride.

14. The method according to claim 10, wherein said second dielectric layer comprises oxide.

15. The method according to claim 10, wherein said second dielectric layer is formed by deposition process.

16. The method according to claim 10, wherein said polysilicon is formed by deposition process.

17. The method according to claim 10, wherein said polysilicon is used as an etching mask.

18. The method according to claim 10, wherein said second dielectric layer is etched by an anisotropic etch process.

19. The method according to claim 10, wherein said solid cylindrical conductor is etched by an anisotropic etch process.

20. The method according to claim 10, wherein said step of etching said solid cylindrical conductor results in the formation of a hollow cylindrical conductor.

21. The method according to claim 10, wherein said polysilicon layer is formed by the following steps: depositing a polysilicon material on said second dielectric layer; and etching back said polysilicon material.

22. The method according to claim 10, wherein said polysilicon layer is removed by an antisotropic etch process.

* * * * *